(12) United States Patent
Beck

(10) Patent No.: US 10,677,863 B2
(45) Date of Patent: Jun. 9, 2020

(54) METHOD AND MAGNETIC RESONANCE APPARATUS AUTOMATICALLY FILLING A MEASURING QUEUE WITH VARYING IMAGING PARAMETERS

(71) Applicant: Siemens Healthcare GmbH, Erlangen (DE)

(72) Inventor: Thomas Beck, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 103 days.

(21) Appl. No.: 15/960,001

(22) Filed: Apr. 23, 2018

(65) Prior Publication Data

US 2018/0306878 A1 Oct. 25, 2018

(30) Foreign Application Priority Data

Apr. 24, 2017 (DE) .......................... 10 2017 206 853

(51) Int. Cl.
*G01R 33/36* (2006.01)
*G01R 33/34* (2006.01)
*G01R 33/54* (2006.01)
*G01R 33/565* (2006.01)
*G01R 33/561* (2006.01)

(52) U.S. Cl.
CPC ............. *G01R 33/36* (2013.01); *G01R 33/34* (2013.01); *G01R 33/543* (2013.01); *G01R 33/5616* (2013.01); *G01R 33/56536* (2013.01)

(58) Field of Classification Search
CPC ...... G01R 33/34; G01R 33/36; G01R 33/543; G01R 33/5616; G01R 33/56536
See application file for complete search history.

(56) References Cited

U.S. PATENT DOCUMENTS

| 4,949,042 A | * | 8/1990 | Kuhara | ............. G01R 33/4828 324/309 |
| 5,151,656 A | * | 9/1992 | Maier | ............. G01R 33/56554 324/307 |
| 5,808,467 A | * | 9/1998 | Ochi | ................. G01R 33/3415 324/309 |

(Continued)

OTHER PUBLICATIONS

"Topup—A tool for estimating and correcting susceptibility induced distortions," fsl.fmrib.ox.ac.uk/fsl/fslwiki/topup (2013).

*Primary Examiner* — Dixomara Vargas
(74) *Attorney, Agent, or Firm* — Schiff Hardin LLP

(57) ABSTRACT

In a method for performing MR measurements in an MR system on an object, MR signals of the object are acquired using an imaging sequence with a first set of imaging parameters. An amended copy of the imaging sequence is automatically created with a second set of imaging parameters, which has all the imaging parameters used in the first set, wherein the second set has at least one imaging parameter modified with respect to the first set that differs from the corresponding imaging parameter of the first set according to a defined amendment. The remaining imaging parameters of the second set correspond to the imaging parameters of the first set. The amended copy is automatically configured in a measurement queue in which all the imaging sequences are stored that are to be carried out in the future on the examination object are stored.

19 Claims, 3 Drawing Sheets

(56) References Cited

U.S. PATENT DOCUMENTS

| | | | | |
|---|---|---|---|---|
| 6,188,219 | B1 * | 2/2001 | Reeder | G01R 33/58 |
| | | | | 324/307 |
| 6,329,821 | B1 * | 12/2001 | Zhou | G01R 33/56563 |
| | | | | 324/307 |
| 7,358,728 | B2 * | 4/2008 | Nozaki | G01R 33/56563 |
| | | | | 324/307 |
| 7,868,614 | B2 * | 1/2011 | Bito | G01R 33/3415 |
| | | | | 324/307 |
| 8,228,063 | B2 * | 7/2012 | Kimura | A61B 5/055 |
| | | | | 324/307 |
| 8,339,136 | B2 * | 12/2012 | Taniguchi | A61B 5/0555 |
| | | | | 324/306 |
| 10,024,943 | B2 * | 7/2018 | Machii | G01R 33/56554 |
| 10,401,456 | B2 * | 9/2019 | De Weerdt | G01R 33/5611 |
| 2004/0140803 | A1 | 7/2004 | Deimling | |
| 2006/0033494 | A1 | 2/2006 | Hennig et al. | |
| 2007/0164742 | A1 * | 7/2007 | Bito | G01R 33/34046 |
| | | | | 324/318 |
| 2008/0048659 | A1 * | 2/2008 | Reeder | G01R 33/4824 |
| | | | | 324/312 |
| 2010/0013475 | A1 * | 1/2010 | Kimura | A61B 5/055 |
| | | | | 324/307 |
| 2010/0272336 | A1 * | 10/2010 | Taniguchi | A61B 5/0555 |
| | | | | 382/131 |
| 2011/0085722 | A1 | 4/2011 | Feiweier | |
| 2016/0109546 | A1 * | 4/2016 | Machii | G01R 33/56554 |
| | | | | 324/322 |
| 2016/0349339 | A1 | 12/2016 | Brady-Kalnay et al. | |
| 2018/0238986 | A1 * | 8/2018 | De Weerdt | G01R 33/5611 |

\* cited by examiner

METHOD AND MAGNETIC RESONANCE APPARATUS AUTOMATICALLY FILLING A MEASURING QUEUE WITH VARYING IMAGING PARAMETERS

BACKGROUND OF THE INVENTION

Field of the Invention

The present invention concerns a method for performing magnetic resonance (MR) measurements with an MR apparatus. The invention further concerns an MR apparatus and a non-transitory, electronically readable data carrier that implement such a method.

Description of the Prior Art

When generating MR images, it is often necessary to repeat an MR measurement while varying individual imaging parameters in a series of scans (individual data acquisitions) of the same subject (patient). In this case, it is important that only a single MR parameter or only a small number of MR parameters is/are changed, while the vast majority of the parameters remains unchanged.

An example of such an application is the correction of susceptibility artifacts in echo-planar imaging. Distortions are caused by local inhomogeneities of the magnetic field in echo-planar imaging. These susceptibility artifacts occur particularly at tissue boundaries. In neurological imaging, for example, they occur in the region of the nasal cavity or the auditory canal. A problem caused by these artifacts is that they disturb the geometric correspondence between the structural image data and the echo-planar-acquired image data, such as the diffusion image data or functional image data. In order to be able to correct these artifacts, the field distortions must be estimated, for example, in order to be able to apply a correction method subsequently. A frequently employed method for estimating and correcting the effects of susceptibility is implemented in the FSL topup software package, wherein a number of image data sets of the same object are analyzed, and wherein the image data sets have different distortions as a result of varying imaging parameters respectively used to acquire the sets. On the basis of the various distortions, it is possible to estimate the field inhomogeneities and/or a distortion field in order to then generate a distortion-free and/or artifact-free image.

It is important that all the imaging parameters, with the exception of a selectively varied parameter, are to remain unchanged. In particular, it is important that the position of the imaging slices or saturation regions for the various measurements are completely identical.

A further technique is the measurement of tissue structures with varying orientations. Because 2D measurements usually have a very high spatial resolution within the 2D plane or slice, but a lower resolution perpendicular to the plane or slice, it may be desirable to repeatedly record the structure with different orientations. Likewise, in the context of comparative studies, it is desirable to carry out a defined variation of imaging parameters in which it is ensured that only some defined imaging parameters are amended and other imaging parameters remain unchanged.

Conventionally, it has been possible to match a second imaging sequence to a first imaging sequence by transferring individual imaging parameters from the first imaging sequence. However, the second imaging sequence is a completely independent, new imaging sequence, so individual parameters have to be adapted in the second imaging sequence.

Furthermore, it is possible to store a number of copies of an imaging sequence and to link these to one another. However, this approach has a number of disadvantages because only those parameters are transmitted that are match restricted to the geometric properties. Modifying individual imaging parameters of the first imaging sequence is usually highly prone to error because the operator must manually adjust all further repetitions of the imaging sequence and/or a succession of imaging sequences. In the event that all the imaging sequences are arranged one following the other in the so-called measuring queue, this is still possible relatively easily, but the linked imaging sequences can also be arranged in various positions in the measuring queue.

Furthermore, application cases are known in which MR imaging parameters of the imaging sequence are to be specifically modified. For example, the echo time TE in the first imaging sequence should be measured with a first value of 30 ms, while it is to be measured in a second sequence with a time of 33 ms and in a further imaging sequence with an echo time of 36 ms. In the event of such a sequence of the imaging sequences, the operator must know that the parameters for the second and third imaging sequences are to be adjusted. In practice, this is prone to error and inevitably leads to erroneous image data.

When updating a software version of the software for controlling the MR system, the relationship between imaging parameters is often lost. For example, it is possible that in a newer software version an echo time of TE=30 ms is no longer supported, but rather a value of TE=32 ms. When the second and third imaging sequence is then used with an echo time of 33 and 36 ms, this results in inconsistent data.

SUMMARY OF THE INVENTION

An object of the invention is to address the problem that exists in these conventional approaches of error susceptibility reducing in the case of measurement repetitions with slightly amended parameters.

In a method for performing MR measurements with an MR apparatus in an examination of an examination object in accordance with the invention, MR signals of the object are recorded (acquired) using an imaging sequence that employs a first set of imaging parameters. Furthermore, an amended copy of the imaging sequence is automatically created using a second set of imaging parameters, which has all the imaging parameters used in the first set. The second set has at least one modified imaging parameter compared with the first set, which differs from the corresponding imaging parameters of the first set according to a specified amendment. The remaining imaging parameters of the second set correspond to the imaging parameters of the first set. The amended copy of the imaging sequence is automatically configured into a measuring queue in which are stored all the imaging sequences to be performed in this examination on the object. A control computer that operates the MR apparatus accesses the measuring queue and generates respective sets of control signals respectively corresponding to each of the imaging sequences as they occur in the queue, and provides those control signals to the MR apparatus in order to operate the MR apparatus according to each of the imaging sequences.

The method described above ensures that an MR measurement can be carried out again under almost unchanged conditions, wherein one or more imaging parameters are specifically modified in the second set of imaging parameters. The one or more imaging parameters is or are modified by a defined amendment, wherein all other imaging parameters, i.e., the other imaging parameters of the second set, correspond to the imaging parameters of the first set.

It is possible to create an amended copy for each modified imaging parameter of the second set in which an imaging parameter has been modified relative to the first set and to configure it in the measurement queue. This means that for each amendment of an imaging parameter in the second set of the imaging parameters, the amended copy is configured in the measuring queue such that the measurement can be repeated for each imaging sequence with an amended imaging parameter.

Furthermore, it is possible that, with the copy stored and amended in the measuring queue, a recording of the MR signals is automatically started. As a result, the operator no longer has the possibility of changing imaging parameters, thereby avoiding the situation in which the measurements can no longer be compared with the first set and the second set as a result of unintentional modification of imaging parameters or other parameters.

However, it is also possible that an interaction with the operator of the MR system is necessary in order to start the imaging sequence with the amended copy. This can be useful, for example, if the start of measurement is to be delayed, such as when a measurement is to be started before and after the administration of contrast agent. In this case, the operator can start further measurement with the second set of imaging parameters after the administration of the contrast agent.

The at least one modified imaging parameter in the second set can be generated on the basis of one or more values of imaging parameters in the first set. In this case, the value of the amended imaging parameter depends on the value and/or the values in the first set of imaging parameters. An imaging parameter such as the echo time or inversion time can be modified by an automatic increase or decrease of the corresponding imaging parameter of the first set by a defined offset value. In another example, the corresponding imaging parameter of the first set can be multiplied by a defined factor or divided by a defined factor for the second set.

It is also possible for the at least one modified imaging parameter in the second set to be generated regardless of the value of the imaging parameter in the first set. Here, for the second set the value of the first set is simply overwritten with the new value, regardless of the value of the imaging parameter in the first set.

The amended copy of the imaging sequence with all the imaging parameters can be created only when the recording of the MR signals with the first set of imaging parameters has been completed. In this case, it is ensured that precisely the same imaging parameters are used in the amended copy, apart from the one modified parameter, as in the first measurement performed.

The amended copy of the imaging sequence can be positioned directly in the next position in the measuring queue, or it is also possible to configure the amended copy of the imaging sequence in the measuring queue in a defined position after at least one further imaging sequence. An offset parameter defined for this purpose can be used that indicates the position for insertion in the measurement queue. An example of this is the creation of a B0 field map at the start of an MR measurement and a repetition of this field map measurement at the end of the measurements performed.

The amended copy is preferably stored in the measurement queue such that a change in the imaging parameters in the second set of the MR imaging parameters is no longer possible.

Furthermore, it is possible to calculate at least one first parameter, for example, intensity parameter, based on the recorded MR signals, wherein the modified imaging parameter of the second set is then determined while taking into account the calculated first parameter. This first parameter can be a signal intensity in the MR image, for example, or a calculated respiratory or heart rate. The modified imaging parameter may then depend on this calculated parameter such as the signal intensity or the calculated heart or respiratory rate and is determined using the calculated values.

Furthermore, it is possible to automatically determine a tissue parameter of the object for examination based on the MR signals which were measured with the first set of imaging parameters and based on the MR signals which were measured with the second set of MR parameters. The tissue parameter can be, for example, a T1 time, a T2* or a T2 time if the modification of the parameters in the data records makes it possible to calculate the tissue parameter by means of the course of the signal intensity.

The MR signals can be recorded with an echo-planar imaging sequence, wherein only the direction of a phase coding gradient is switched for the amended copy, and the MR signals are recorded with the amended copy. As a result, it is possible to automatically determine a susceptibility artifact by comparing the MR image with the amended direction of the phase coding gradient. It is then possible to determine a corrected MR image in which this susceptibility artifact was reduced and/or removed.

Furthermore, the invention concerns an MR apparatus that is designed to perform the aforementioned steps. The MR apparatus has a control computer and a memory. The memory stores control information (code) that can be executed by the control computer so the MR apparatus performs the steps described above.

The present invention also encompasses a non-transitory, computer-readable data storage medium encoded with programming instructions that, when the storage medium is loaded into a computer or computer system of an MR apparatus, cause the computer or computer system to operate the MR apparatus in order to execute any or all embodiments of the method according to the invention, as described above.

DESCRIPTION OF THE PREFERRED EMBODIMENTS

Figure 1:
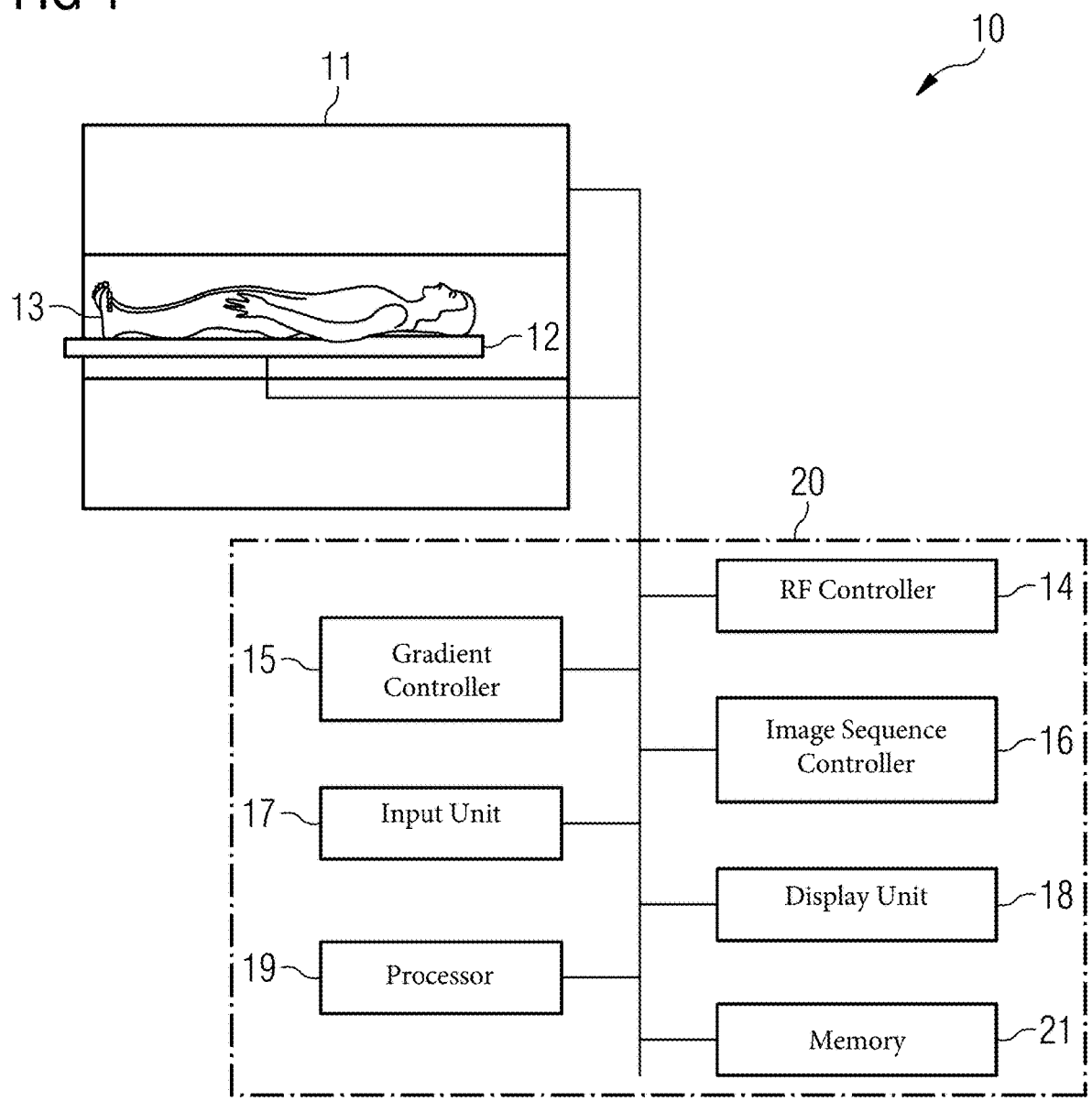
FIG. 1 schematically illustrates an MR apparatus with which MR measurements according to the invention can be performed with the creation of a modified copy of the imaging sequence in a measuring queue.

The present invention is explained in more detail below on the basis of preferred embodiments with reference to the accompanying drawings. In the figures, the same reference characters denote identical or similar elements. Furthermore, the figures are diagrammatic representations of various embodiments. The elements shown in the figures are not necessarily drawn to scale, rather they are reproduced such that those skilled in the art will understand their function and purpose. The connections between functional units or other elements used in the figures can also be implemented as indirect connections, wherein the connection can be wired or wireless. Functional units can be implemented as hardware, software, or a combination of hardware and software.

FIG. 1 illustrates an MR apparatus with which MR measurements are performed such that automated further MR measurements are possible that only differ from a previous measurement only as to defined MR imaging parameters. The MR apparatus 10 has a scanner 11 with a magnet 13 that generates a polarization field B0. A person 13 for examination arranged on a bed 12 and is moved into the scanner 11 in order for spatially-coded magnetic resonance signals to be recorded. The coils used for signal recording, such as a whole-body coil or local coils, are not shown for clarity. The invention can also be used for parallel imaging in which the MR signals are recorded simultaneously with a number of local coils, or a coil array of local coils. By radiating radio-frequency pulses and switching magnetic field gradients, the magnetization of nuclear spins of the person 13 produced by the polarization field B0 is deflected out of the equilibrium position and spatially coded. The resulting signals are detected by the receiving coils. How MR images are generated by radiating the RF pulses and by switching magnetic field gradients in different combinations and sequences is in principle known to those skilled in the art, and thus need not be explained in more detail herein.

Furthermore, the MR apparatus 10 has a control computer 20 that controls the MR apparatus 10. The control computer 20 has a gradient controller 15 for controlling and switching the necessary magnetic field gradients. An RF controller 14 is provided to control and generate the RF pulses in order to deflect the magnetization. An image sequence controller 16 controls the sequence of the magnetic field gradients, the signal detection and RF pulses and thus indirectly the gradient controller 15, the receiving coils, and the RF controller 14. An operator can control the MR system via an input unit 17 and MR images, and other information necessary for controlling the examination can be displayed on a display unit 18. A processor 19 is provided to control the various units in the control computer 20. Furthermore, a memory 21 is provided in which electronically readable control information (code) is stored in program modules or program resources which, when executed by the processor 19, controls the sequence of the apparatus 10. The control computer 20 and/or the processor 19, as explained below, is designed such that automatically modified copies of executed imaging sequences are stored in a measuring queue.

In particular, the control computer 20 and/or the processor 19 is configured such that when performing a measurement, i.e. when performing an imaging sequence either before or after completion of the measurement, the current measurement is duplicated in a copy. A copy of the imaging sequence is created and, after duplication, a specified number of measurement parameters are automatically modified according to a defined scheme in the generated copy. Furthermore, the amended copy with the amended imaging parameters is stored in the measuring queue in which all the imaging sequences and program sequences which are to be performed on the person 13 are stored. In this way, the possibility of the operator carrying out amendments to the imaging parameters is minimized. The first recording of the MR images ensues with a first set of imaging parameters. The created copy has all the imaging parameters used in the first set and one of these imaging parameters or a plurality of these imaging parameters is modified according to a defined scheme. This then leads to the second set of imaging parameters. This second set of imaging parameters differs from the first set for example, in that a fixed value is added to one of the imaging parameters such as, for example, the echo time, or the inversion time, or a fixed value is deducted from the corresponding imaging parameters of the first set. A further possibility is to multiply an imaging parameter of the first set by a fixed factor and/or to divide the value of the first set by a fixed value. Furthermore, there is the possibility of calculating an MR image, for example, from the MR signals which were generated with the first set of imaging parameters in order to determine a parameter from the calculated MR image which serves to determine the corresponding imaging parameter in the second set. Thus, for example, it is possible to calculate an intensity image from the MR signals with the first set of imaging parameters and to calculate the corresponding imaging parameters for the second set from the calculated intensity in certain areas of the object for examination. If, for example, the signal intensity in the white brain matter is lower than a limit value during the examination of the brain, it is thus possible to adjust an echo time TE or an inversion time TI accordingly as a function of the determined value of the signal intensity for the second set of imaging parameters. However, the calculated parameter need not necessarily be calculated in the image space; other parameters can be calculated from the recorded MR images, for example, a diffusion coefficient or other parameters which can be calculated on the basis of the MR signals.

In this case, it is possible for one of the MR imaging parameters to be changed and for a corresponding amended copy of the imaging sequence to be stored in the measuring queue for each amendment of one of the imaging parameters so that a new MR measurement with the amended copy is performed for each amended imaging parameter. However, more than just one imaging parameter can also be modified in each amended copy. The variation of the imaging parameters can also be performed in a combinatory manner. This means that a number of imaging parameters is varied by a series of amendments such that for each combinatorial possibility of the amended imaging parameters, an amended copy of the imaging sequence is generated and stored in the measurement queue. Writing the amended copy into the measuring queue ensures that the operator does not inadvertently violate the consistency of the recorded MR signals by displacing the slice stack or by means of other unintended amendments.

The method described above also ensures that any amendments to the imaging sequence in the first set of imaging parameters are sure to be applied to the further measurements. A deviation from parameters which is not caused intentionally by the user is practically impossible as a result.

The amended copy of the imaging sequence is preferably produced after completion of the measurement. In this way, it can be ensured that the imaging parameters used for the measurement are actually also available in the copy. Naturally, it is also possible to create the copy immediately before the start of the measurement of the MR signals or during the measurement of the MR signals.

It is desirable for the measurement of the MR signals with the amended copy of the imaging sequence is automatically started immediately without interaction with the operator. However, it is also possible that the measurement of the MR signals with the amended copy is not started automatically but the start of measurement is delayed and takes place after a user interaction. An example of this is the repetition of an MR measurement before and after the administration of contrast agent. In this case, it is desirable to start further measurement with the amended set of the imaging parameter or imaging parameters only after administration of the contrast agent. Furthermore, it is possible to determine the position of the amended copy in the measuring queue. The amended copy need not necessarily be the next imaging sequence in the measuring queue. A parameter which indicates the insertion position in the measuring queue can be used. An example of this is the creation of a B0 field map at the start of a study and a repetition of this field map measurement at the end of a study.

Figure 2:
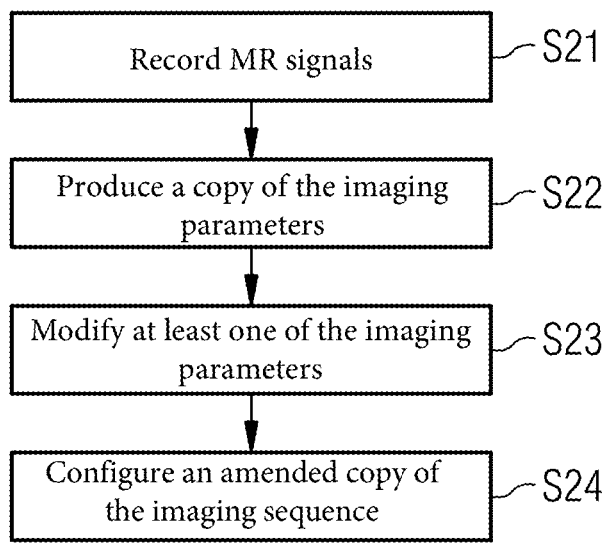
FIG. 2 is a flowchart of the basic steps implemented by the MR system shown in FIG. 1 for the automatic creation of a modified copy of an imaging sequence.

FIG. 2 summarizes the essential steps for generating the amended copy. The MR signals are recorded in a step S21, wherein a first set of imaging parameters is used. In a step S22, a copy of the imaging sequence comprising all the imaging parameters of the imaging sequence of step S21 is then produced. The modification of at least one of the imaging parameters of the first set finally takes place in step S23. In the case of this amendment, as explained above, said amendment can depend on the value of the imaging parameter which was used in the first set of imaging parameters, or the amendment is independent of the value of the imaging parameter or imaging parameters in the first set, for example, a fixed value of the imaging parameter is used which overwrites the previous value in the first set. This modification of the imaging parameter in step S23 now results in an amended copy of the imaging sequence with a second set of imaging parameters, wherein this second set differs from the first set of imaging parameters in at least one imaging parameter.

In step S24, the amended copy of the imaging sequence is configured in the measurement queue. The production of the copy can be performed such that first the copy is produced with all the identical imaging parameters and then the modified copy is generated. It is likewise possible for the amended copy to be generated with the at least one modified imaging parameter immediately when the copy is generated.

Figure 3:
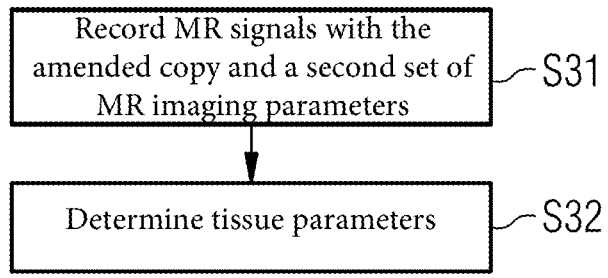
FIG. 3 is a flowchart of the basic steps performed by the MR system of FIG. 1 to determine tissue parameters based on the method shown in FIG. 2.

A sequence is now described in connection with FIG. 3 in which, with the use of the automatically generated amended copies, a tissue parameter such as a T1 time, T2 time or T2 time is calculated. This calculation can likewise take place automatically. In this determination of the tissue parameters, the steps S21 to S24 explained in connection with FIG. 2 were carried out so that the acquired MR signals are now available with the first set of imaging parameters and the amended copy is in the measurement queue. In a step S31, the MR signals are then recorded with the amended copy and the second set of MR imaging parameters. In this case, this recording of the MR signals can contain a recording of an amended copy. However, it is also possible to record a number of amended copies with a number of different imaging parameters, for example, different inversion times TI or different echo times TE. Based on the recorded MR signals, tissue parameters can then be determined in a step S32, for example, by adapting a curve to the temporal signal profile in the individual images of the different MR signals. Thus, it is then possible to automatically calculate a T1 time, a T2* time or T2 time for the examined tissue.

Figure 4:
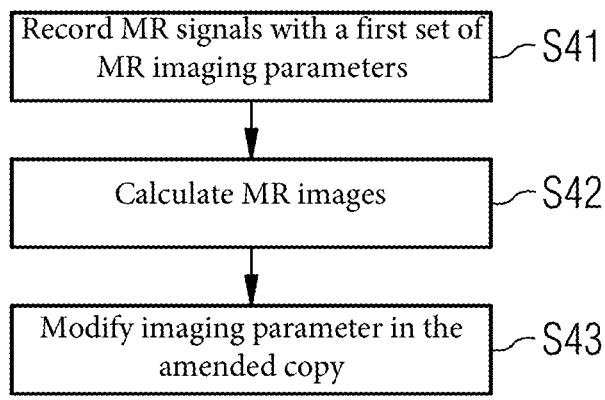
FIG. 4 is a flowchart of the basic steps for calculating a parameter when creating an amended copy of an imaging sequence, on the basis of which the modified imaging parameter is calculated.

FIG. 4 explains how the amended copy is generated as a function of the recorded MR signals with the first set of imaging parameters. In a step S41, the MR signals are recorded with the first set of MR imaging parameters. MR images are subsequently calculated in a step S42 and the signal intensity is considered, for example the signal intensity in the recorded white brain matter. The modified imaging parameter can then be determined using the signal intensity. If, for example, the signal intensity is lower than a limit value, an imaging parameter can be modified accordingly, for example, an echo time can be shortened, the inversion time can be lengthened or shortened, etc. In another example, an average heart rate of the visitor is determined, for example, on the basis of the recorded MR signals, for example by evaluating the movement of the heart shown in the MR images. For example, an imaging parameter such as the repetition time TR can be modified from the resulting heart rate such that it is adapted to the particular heart rate. This modification of the imaging parameter in the amended copy is then carried out in step S43.

Figure 5:
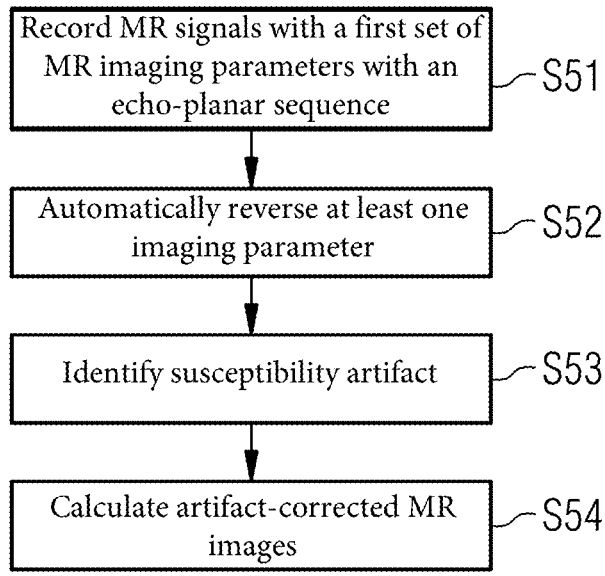
FIG. 5 is a flowchart of the basic steps performed by the MR system of FIG. 1 to generate MR images with reduced susceptibility artifact.

FIG. 5 explains how a susceptibility artifact can be determined by automatically adapting the phase coding direction in echo-planar imaging so that this susceptibility artifact can be removed from the further calculated MR images. In a step S51, the recording of the MR signals ensues with a first set of MR imaging parameters with an echo-planar imaging sequence. In this case, a phase coding gradient which applies short flashes in one direction is used, for example the positive gradient direction. In a step S52, the at least one imaging parameter, here the direction of the phase coding direction, is now automatically reversed, and the MR signals are recorded a further time with the second set of imaging parameters, in this case flashes in the negative gradient direction. Due to the phase coding gradients used in different directions, the generated MR image data has opposite artifacts, for example, the susceptibility artifact in the region of the nasal cavity or of the auditory canals. This susceptibility artifact can be identified (S53) using the FSL topup method, for example, and artifact-corrected MR images can be calculated (step S54).

The amendments described above in the at least one imaging parameter and the automatic storage in the measurement queue can be visualized by the operator, wherein for example, in the amended copy of the imaging sequence of the operator, the amended imaging parameters or the amended imaging parameter can be displayed in color in order to inform the operator which imaging parameter was modified during the second measurement.

In summary, the application allows different imaging sequences to be matched to one another without manual intervention such that the inconsistency of the generated MR data is reduced as it is ensured that only defined imaging parameters are changed during a measurement sequence while all the other imaging parameters remain the same.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for operating a magnetic resonance (MR) apparatus, comprising:
   in a computer, generating control signals corresponding to an imaging sequence with a first set of imaging parameters and providing said control signals to an MR apparatus in order to execute said imaging sequence so as to acquire MR data from an examination subject in a first of a series of scans of the examination subject with the MR apparatus;
   in said computer, automatically generating an amended copy of said imaging sequence that comprises a second set of imaging parameters respectively corresponding to the imaging parameters of said first set of imaging parameters, but with at least one imaging parameter of said second set being modified with respect to the corresponding imaging parameter of the first set, so as to differ from the corresponding imaging parameter of the first set according to a defined amendment, with all other imaging parameters of the second set respectively corresponding to the imaging parameters of the first set;
   in said computer, automatically configuring the amended copy in a measurement queue in a memory in which are stored imaging sequences to be performed on the examination subject in said series; and
   from said computer, accessing said measurement queue in said memory in order to generate respective control signals for each of said imaging sequences in said series, and providing said controls signals to said MR apparatus in order to operate the MR apparatus so as to execute said imaging sequences so as to acquire MR data from the examination subject with each of said imaging sequences,
   wherein the first set of imaging parameters and the second set of imaging parameters include measurement values associated with executed measurements for each of said imaging sequences in said series, and
   wherein the modification of the at least one imaging parameter of the second set in accordance with the defined amendment includes an adjustment to a measurement value such that the same measurements are performed for each of said imaging sequences in said series but with at least one different measurement value.

2. A method as claimed in claim 1 comprising modifying multiple respective imaging parameters of said second set with respect to multiple, corresponding imaging parameters of said first set and generating an amended copy for each modified imaging parameter and including each amended copy in said measurement queue.

3. A method as claimed in claim 1 comprising automatically starting said respective acquisitions of MR data using said amended copy of said imaging sequence in said measurement queue.

4. A method as claimed in claim 1 comprising modifying said at least one imaging parameter of said second set dependent on a value of the corresponding imaging parameter of the first set.

5. A method as claimed in claim 4 comprising giving said at least one parameter in said second set a value that is an increase or a decrease, by a predetermined offset value, of the value of the corresponding image parameter of the first set.

6. A method as claimed in claim 4 comprising giving said at least one parameter in said second set a value that is a product or a quotient, by a predetermined factor, of the value of the corresponding image parameter of the first set.

7. A method as claimed in claim 1 comprising modifying said at least one imaging parameter in said second set independently of a value of the corresponding image parameter of the first set.

8. A method as claimed in claim 1 comprising generating said amended copy when acquisition of the MR data with the imaging sequence using said first set of imaging parameters has been completed.

9. A method as claimed in claim 1 comprising inserting said amended copy of the imaging sequence in a defined position in said measuring queue, that follows at least one other imaging sequence in said measuring queue.

10. A method as claimed in claim 1 comprising inserting said amended copy in said measuring queue so as to not permit imaging parameters in the amended copy to be further amended prior to operating the MR apparatus with said amended copy in order to acquire MR data from the examination subject.

11. A method as claimed in claim 1 comprising, in said computer, calculating at least one parameter from the MR data acquired with said imaging sequence of said first set of imaging parameters, and modifying said at least one parameter of said second set dependent on said calculated parameter.

12. A method as claimed in claim 1 comprising, in said computer, automatically calculating a tissue parameter of the examination object from the MR data respectively acquired by operating said MR apparatus with said first set of imaging parameters and said second set of imaging parameters.

13. A method as claimed in claim 1 wherein at least said imaging sequence with said first set of imaging parameters and said imaging sequence with said second set of imaging parameters are each an echo-planar imaging sequence in which a phase coding gradient is activated in a phase coding direction, and changing the phase coding gradient direction when operating said MR apparatus to execute said imaging sequence with said second set of imaging parameters, compared to the phase coding direction used when operating said MR apparatus with said imaging sequence with said first set of imaging parameters.

14. A method as claimed in claim 13 comprising, in said computer, determining a susceptibility artifact from the MR data respectively acquired by operating said MR apparatus with said first set of imaging parameters and with said second set of imaging parameters and, in said computer, generating at least one corrected MR image of the examination subject wherein said susceptibility artifact is removed.

15. A magnetic resonance (MR) apparatus comprising:
   an MR data acquisition scanner;
   a computer configured to generate control signals corresponding to an imaging sequence with a first set of imaging parameters, and to provide said control signals to said MR data acquisition scanner in order to execute said imaging sequence so as to acquire MR data from an examination subject in a first of a series of scans of the examination subject with the MR apparatus;
   said computer being configured to automatically generate an amended copy of said imaging sequence that comprises a second set of imaging parameters respectively corresponding to the imaging parameters of said first set of imaging parameters, but with at least one imaging parameter of said second set being modified with respect to the corresponding imaging parameter of the first set, so as to differ from the corresponding imaging parameter of the first set according to a defined amendment, with all other imaging parameters of the second set respectively corresponding to the imaging parameters of the first set;

said computer being configured to automatically organize the amended copy in a measurement queue in a memory in which are stored all imaging sequences to be performed on the examination subject in said series; and said computer being configured to access said measurement queue in said memory in order to generate respective control signals for each of said imaging sequences in said series, and to provide said controls signals to said MR apparatus in order to operate the MR apparatus so as to execute said imaging sequences so as to acquire MR data from the examination subject with each of said imaging sequences, wherein the first set of imaging parameters and the second set of imaging parameters include measurement values associated with executed measurements for each of said imaging sequences in said series, and wherein the modification of the at least one imaging parameter of the second set in accordance with the defined amendment includes an adjustment to a measurement value such that the same measurements are performed for each of said imaging sequences in said series but with at least one different measurement value.

16. A non-transitory, computer-readable data storage medium encoded with programming instructions, said storage medium being loaded into a computer of a magnetic resonance (MR) apparatus, and said programming instructions causing said computer to:

generate control signals corresponding to an imaging sequence with a first set of imaging parameters and providing said control signals to the MR apparatus in order to execute said imaging sequence so as to acquire MR data from an examination subject in a first of a series of scans of the examination subject with the MR apparatus;

generate an amended copy of said imaging sequence that comprises a second set of imaging parameters respectively corresponding to the imaging parameters of said first set of imaging parameters, but with at least one imaging parameter of said second set being modified with respect to the corresponding imaging parameter of the first set, so as to differ from the corresponding imaging parameter of the first set according to a defined amendment, with all other imaging parameters of the second set respectively corresponding to the imaging parameters of the first set;

configure the amended copy in a measurement queue in a memory in which are stored imaging sequences to be performed on the examination subject in said series; and access said measurement queue in said memory in order to generate respective control signals for each of said imaging sequences in said series, and provide said controls signals to said MR apparatus in order to operate the MR apparatus so as to execute said imaging sequences so as to acquire MR data from the examination subject with each of said imaging sequences, wherein the first set of imaging parameters and the second set of imaging parameters include measurement values associated with executed measurements for each of said imaging sequences in said series, and wherein the modification of the at least one imaging parameter of the second set in accordance with the defined amendment includes an adjustment to a measurement value such that the same measurements are performed for each of said imaging sequences in said series but with at least one different measurement value.

17. A method as claimed in claim 1, wherein the second set of imaging parameters is from among a plurality of second sets of imaging parameters corresponding to a combination of amendments to individual ones of a plurality of variations of the first set of imaging parameters such that, for each combinatorial possibility of amended imaging parameters, an amended copy of the imaging sequence is generated and stored in the measurement queue.

18. A method as claimed in claim 1, wherein the imaging parameters include one or more of a tissue parameter, an echo time TE, an inversion time TI, and a phase coding direction.

19. A method as claimed in claim 11, wherein the act of calculating the at least one parameter from the MR data acquired with said imaging sequence includes calculating a signal intensity in a resulting MR image, and wherein the act of modifying the at least one parameter of the second set dependent on the calculated parameter includes modifying the at least one parameter of the second set dependent on the signal intensity in the resulting MR image.

* * * * *